SUPERCONDUCTIVE LOGIC DEVICE

Filed March 8, 1966 3 Sheets-Sheet 1

INVENTORS W. S. BOYLE
G. E. SMITH
BY H. W. Lockhart
ATTORNEY

United States Patent Office 3,384,794

Patented May 21, 1968

3,384,794

SUPERCONDUCTIVE LOGIC DEVICE

Willard S. Boyle, Summit, and George E. Smith, Murray Hill, N.J., assignors to Bell Telephone Laboratories, Incorporated, New York, N.Y., a corporation of New York Filed Mar. 8, 1966, Ser. No. 532,676
4 Claims. (Cl. 317—235)

ABSTRACT OF THE DISCLOSURE

A superconductive logic device includes a superconductive layer in a portion of which superconductivity is induced by establishing a majority carrier density gradient in the layer while simultaneously maintaining constant therein the total carrier concentration. The transition temperature increases above the ambient temperature of the layer in the portion of the layer in which the majority carrier concentration is increased. Consequently that portion, which was initially in a normal resistive state, switches to a superconducting state. The logic device has application as a switch, a memory element and a level detector.

This invention relates to superconductive devices and more particularly to superconductive switching and memory devices utilizing changes in electron concentration to effect changes in transition temperature.

It is well known that many materials lose all apparent electrical resistance when they are subjected to low temperatures in the vicinity of absolute zero. A material exhibiting this characteristic property is called a superconductor and the related phenomenon is termed superconductivity. The transition from a resistive state to a superconducting state occurs abruptly at a critical temperature known as the transition temperature, a particular temperature for each material. It is also known that a transition from a superconducting to a resistive state can be induced in a superconductor at a particular ambient temperature by applying a magnetic field to the superconductor. Increasing the intensity of the magnetic field, which can be applied externally to the superconductor or can be induced internally by the flow of electric current through the superconductor, decreases the transition temperature. If, for instance, in the absence of a magnetic field the temperature of a superconductor is maintained below the transition temperature, then the superconductor will be in a superconducting state. If there is now applied to the superconductor a magnetic field of sufficient mignitude to cause the transition temperature to fall below the temperature of the superconductor, the superconductor will "switch" to the resistive state. This phenomenon will be hereinafter termed "magnetic switching."

Recent developments have made it relatively simple to maintain electrical circuits including superconductors below the transition temperature thereof so that the practical application of superconductive devices in electrical circuits becomes feasible. The peculiar property of superconductors, namely, that the resistance is zero in the superconducting state, makes it possible for individual devices, typically the wire-wound cryotron and the thin film cryotron, to be interconnected to perform logical functions in data processing systems and digital computers. Furthermore, since the devices, such as the thin film cryotron, may be fabricated of extremely thin layers of the order of a few hundred angstrom units in thickness, it can be seen that an individual device may be of very small size. In addition, since the device is operated principally in its region of superconductivity, current flowing therein when the element is superconductive dissipates no power. Accordingly, superconductive devices become extremely attractive for use in a complex system, such as a digital computer, wherein extensive circuits, including the interconnection of a large number of devices, may be operated with extremely low power requirements.

One disadvantage, however, of both the wire-wound and the thin film cryotrons is the limitation of switching speeds to about $10^{-7}$ seconds by inductance effects inherent in magnetically operated devices. This disadvantage is overcome by the present invention.

The object of this invention is a device which performs fundamental switching and memory functions without the limitation of switching speed by inductance effects.

In its preferred form the invention comprises a thin layer of superconductive material which is in the normal or resistive state at the operating temperature. The superconductive material is separated from two metal electrodes thus forming a capacitor-like structure. Ohmic contacts to the superconductive material define a path or channel through it. A conductor is connected to each ohmic contact forming "gate" leads to which signal energy is applied. To each metal electrode is connected a conductor forming a "control" lead to which a control voltage is applied.

One feature of this invention is that the control voltage applied to the metal electrodes produces an electric field across the superconductive material causing an increase of electron concentration (in general, majority carrier concentration) in one side of the material. The material is normally in the resistive state which prevents the flow of signal energy through the channel. The transition temperature increases in the side of the superconductive material having the excess of electrons causing that side of the material to become superconducting. Thus, whereas one side of the material remains resistive, the other becomes superconducting thereby to allow the flow of signal energy through the channel. This phenomenon shall be hereinafter termed "electrostatic switching."

Because this invention employs no magnetic field to effect switching, another feature is that its switching speed is not limited by inductance effects.

The invention and the several objects and features thereof will be understood more clearly and fully from the following detailed description with reference to the accompanying drawings, in which.

Figure 1:
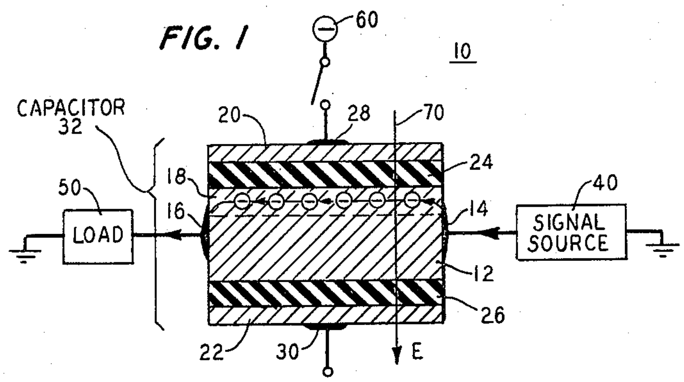
FIG. 1 is a diagram and schematic in cross section illustrating the principal elements of a switching device in accordance with the invention.

Referring to FIG. 1 in detail, the switching device 10 comprises a thin layer 12 of superconductive material separated from metal electrodes 20 and 22 by insulating layers 24 and 26, respectively, thus forming capacitor 32 i.e., the insulators are sufficiently thick to be impervious to both majority and minority carrier flow. Therefore, the total carrier concentration in the layer 12 is maintained constant. A signal source 40 and a load 50 are connected to thin layer 12 through ohmic contacts 14 and 16, respectively, which define a path or channel 18 through the thin layer 12. Control voltage source 60 is connected to the metal electrodes 20 and 22 through contacts 28 and 30, respectively.

The switching device 10, which can be fabricated by well-known vapor deposition techniques such as sputtering or evaporation, typically comprises a thin layer 12 of amorphous bismuth about 0.02$\mu$ in thickness. The bismuth layer is separated from gold electrodes 20 and 22, each 2$\mu$ in thickness, by $SiO_2$ insulating layers 24 and 26, each 0.3$\mu$ in thickness. These dimensions and materials are illustrative only and are not to be construed as a limitation upon the scope of the invention.

The mode of operation is essentially as follows. The thin layer 12 of superconductive material exhibits a high resistance above its characteristic transition temperature. The high resistance of the thin layer 12 prevents the flow of significant signal energy from signal source 40 through the channel 18. The control voltage 60, which charges the capacitor 32, produces an electric field 70 across the superconductive thin layer 12 causing an increase of electron concentration (in general, majority carrier concentration) in one side of the thin layer 12; that is, in the channel 18 i.e., an electron density gradient is established in the layer 12, but the total number of carriers in the superconductor remains constant. As a result the transition temperature increases in the channel 18 causing that side of the layer 12 to become superconducting. Thus, whereas one side of the thin layer 12 remains resistive, the other becomes superconducting thereby allowing the flow of signal energy from signal source 40, through the channel 18, and to the load 50. In this condition the switch is on the "ON" state.

When the control voltage 60 is removed, the electron concentration in the channel 18 will decrease causing a proportional decrease in the transition temperature of the channel 18 thereby switching the channel from superconducting back to resistive. In this condition the switch is in the "OFF" state. Thus, the switching device 10 in the "OFF" state serves to block signal energy and in the "ON" state serves to pass signal energy by means of electro-statically switching the thin layer 12 from a resistive to a superconducting state. The change of state of the superconductor is effected by increasing or decreasing its electron concentration which causes a corresponding change in its transition temperature.

Figure 3:
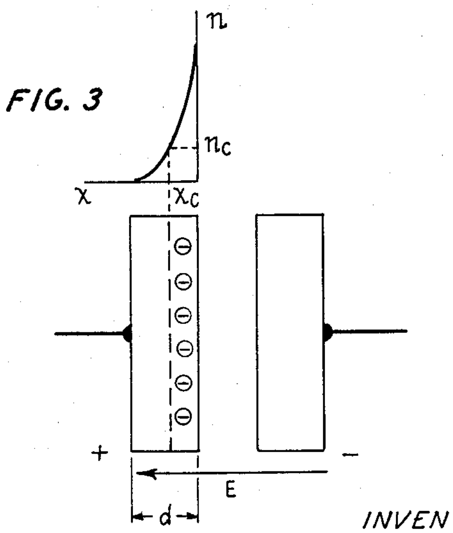
FIG. 3 is a cross-sectional view of the plates of a capacitor showing the variation of electron concentration across the depth of the plates.

The reasons for this phenomenon can be understood more fully by referring to the capacitor comprising superconductive plates shown in FIG. 3. An electric field, E, applied across the capacitor plates in the direction shown, produces a force on electrons in the opposite direction. The electrons are free to move in the direction of the force. As a result an electron density gradient is established, the variation of electron density or concentration with distance into the capacitor plate being essentially exponential. A similar density gradient is established in the superconductive thin layer 12 when the control voltage 60 is applied to the capacitor 32.

For a given applied electric field, E, shown in FIG. 3 superconductivity will be produced only in those portions of the superconductive plate wherein the electron concentration is at least some critical value $n_c$. Thus, superconductivity will be produced only from the surface to a depth $x_c$ into the superconductive plate corresponding to the critical electron concentration $n_c$. Superconductivity will not be produced at depths greater than $x_c$ because in that portion of the superconductive plate the electron concentration falls below $n_c$. Thus the side of the superconductive plate corresponding to $x=0$ to $x=x_c$ becomes superconducting, but the remainder of the superconductive plate remains resistive.

Figure 2:
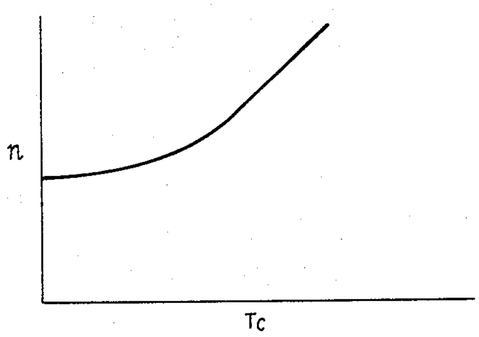
FIG. 2 is a graph indicating the variation in transition temperature with changes in electron concentration.

The variation of transition temperature $T_c$ with changes in electron concentration $n$ is shown in FIG. 2. For electron concentrations above the knee of the curve, the functional relationship between $n$ and $T_c$ has been found to be $$\frac{\Delta T_c}{T_c}=\frac{\Delta n}{n}$$

where $T_c$ is the transition temperature of the superconductor and $n$ is its electron concentration. $\Delta T_c$ is the change in transition temperature induced by a corresponding change $\Delta n$ in electron concentration. The maximum change in surface electron density is given by $$\Delta\sigma=\frac{E_0\epsilon}{e}$$

and the average change in electron concentration in the capacitor plate shown in FIG. 3 is $$\Delta n\frac{\Delta\sigma}{d}$$

where $E_0$ is the breakdown field in the capacitor, $\epsilon$ is the permittivity of the dielectric, $d$ is the thickness of the superconductive plate, and $e$ is the electron charge. With $E_0=10^7$ volts/cm. and $d=200$ A., then $\Delta n=3\times10^{18}$/cm.3. In experiments on superconductors having an electron concentration of about $10^{22}$ electrons per cubic centimeter changes of $$\frac{\Delta T_c}{T_c}=10^{-4}$$

were observed. Superconductors having smaller electron concentration would produce larger changes. Although the apparent change in transition temperature is small, it is sufficient to produce the desired switching function.

Whereas the switching speed of prior magnetically switched devices is limited to about $10^{-7}$ seconds by inductance effects, this invention, which employs electrostatic switching, is not so limited. The capacitance of capacitor 32 can be made small enough to produce switching speeds of at least $10^{-10}$ seconds.

Figure 4A:
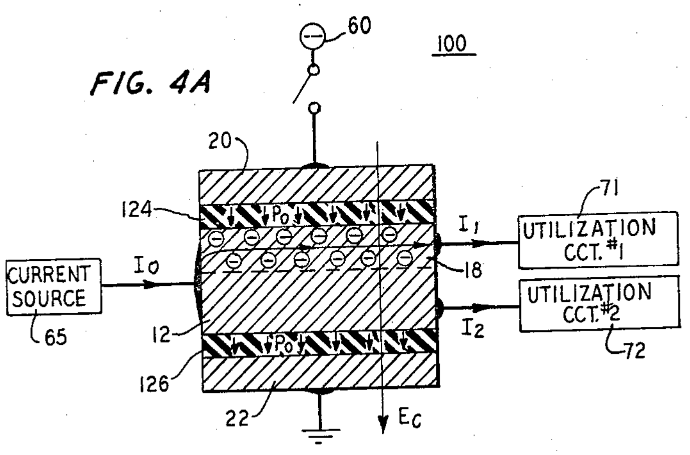
FIGS. 4A and 4B are cross-sectional views of a current steering device in accordance with this invention.
Figure 4B:
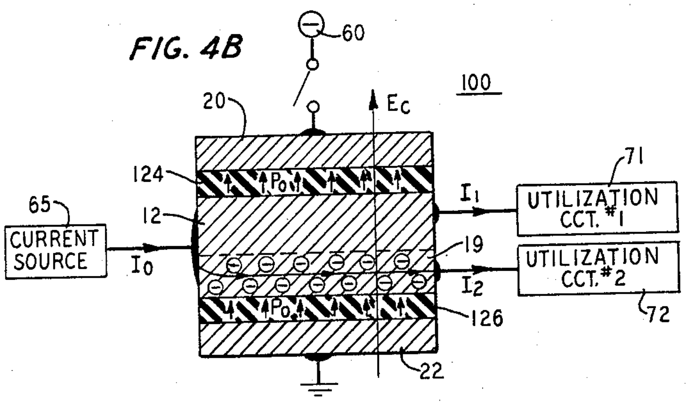
Figure 4C:
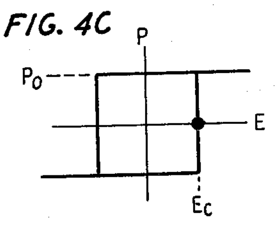
FIG. 4C is a plot of the square loop characteristics of a ferroelectric material.
Figure 4D:
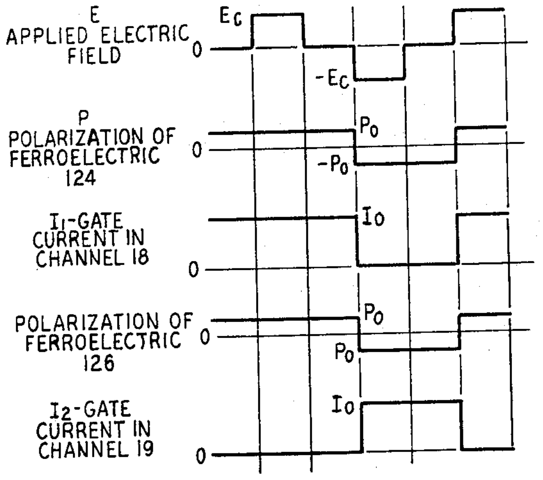
FIG. 4D is a plot of typical waveforms which exist during the operation of the current steering device.

In a second embodiment of the invention both of the insulating layers 24 and 26 are replaced by ferroelectric materials 124 and 126 as shown in FIG. 4A. The switching device 10 of FIG. 1 then operates as a current steering device 100 as depicted in FIG. 4A. A ferroelectric material, typically tungsten trioxide, barium titanate, or lithium niobate, ideally has a square loop characteristic curve as shown in FIG. 4C. That is, the ferroelectric has a residual polarization P of magnitude $\pm P_0$ depending upon the sign of the applied electric field E. Thus, in one mode of operation an electric field $E_c$ applied across the device 100, as shown in FIG. 4A, produces polarization $P_0$ in both ferroelectrics 124 and 126. The side of superconductive thin layer 12 adjacent ferroelectric 124 will become superconducting thereby allowing the flow current from current source 65 through channel 18 to utilization circuit 71. On the other hand, an electric field minus $E_c$ applied across the device 100, as shown in FIG. 4B, produces polarization minus $P_0$ in both ferroelectrics 124 and 126. The side of thin layer 12 adjacent ferroelectric 126 will become superconducting thereby allowing the flow of current from current source 65 through the channel 19 to utilization circuit 72. Typical waveforms are indicated on FIG. 4D. In the operation of current steering device 100, the polarization field P, and not the applied field E, increases the electron concentration in one side of the thin layer. The only purpose of the applied field E is to reverse the direction of the polarization field in the ferroelectric materials.

Figure 5A:
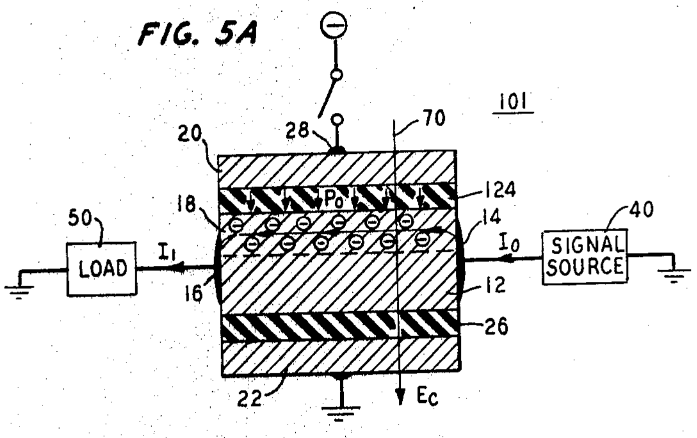
FIG. 5A is a diagram in cross section of a memory device in accordance with the principles of this invention.
Figure 5B:
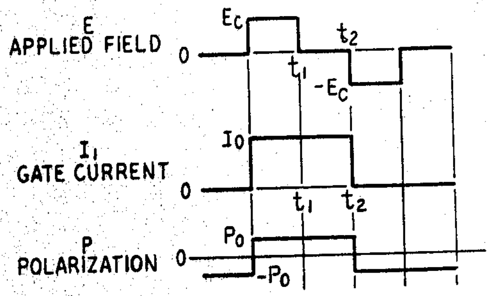
FIG. 5B is a plot of typical waveforms which exist during the operation of the memory device.

FIG. 5A is a cross-sectional view of a memory device 101 in accordance with the principles of the invention. Thereon is indicated a device substantially identical to switching device 10, of FIG. 1 but the insulator 24 has been replaced by ferroelectric 124. The operation of the memory device is substantially the same as that of current steering device 100 previously described. Typical waveforms show in FIG. 5B that memory device 101 "remembers" during time interval $(t_2-t_1)$ even though applied field E has been removed. At time $t_2$, when the applied field is reversed, the memory is erased.

Figure 6:
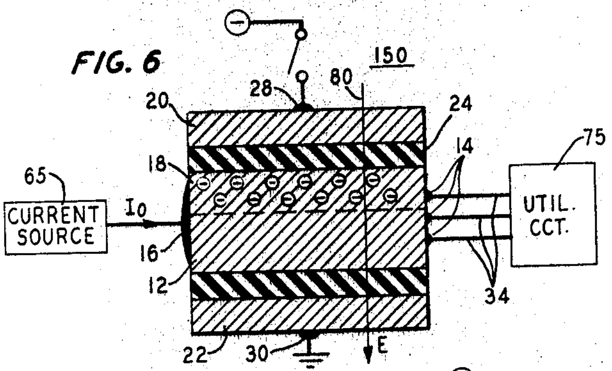
FIG. 6 is a diagram in cross section of a level detector in accordance with the principles of this invention.

In another embodiment the invention operates as a level detector 150 as shown in FIG. 6. Three conductors 34 are connected to the utilization circuit 75 and to the superconductive thin layer 12 through three ohmic contacts 14. The utilization circuit 75 detects current in the conductors 34.

The mode of operation is as follows. The depth of the channel 18 is proportional to the amplitude of the electric fied 80. Thus, increasing the electric field amplitude induces superconductivity at greater depths in the superconductive thin layer 12 and consequently causes current to flow in a greater number of the conductors 34. The utilization circuit 75, by detecting the number of conductors 34 in which current is flowing, is thus capable of detecting the approximate amplitude of the applied electric field 80. The accuracy of the level detector 150 can be increased by connecting a greater number of conductors 34 to the thin layer 12. While only three contacts 14 to the thin layer 12 have been shown, as many contacts as the technology permits would be possible.

Figure 7:
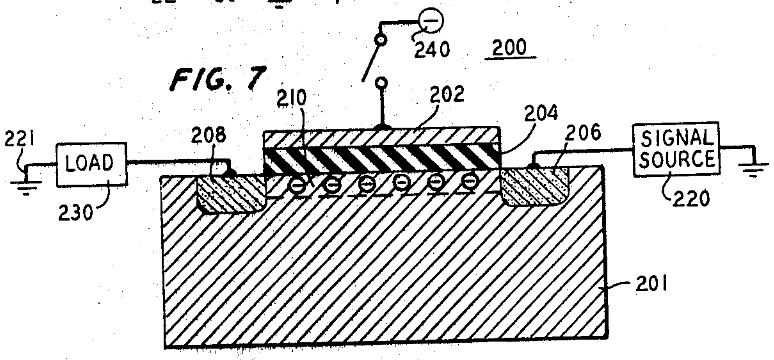
FIG. 7 is a diagram in cross section of another switching device in accordance with this invention.

In another embodiment of this invention, the switching device 200 shown in FIG. 7 comprises a substrate 201 separated from a metal electrode 202 by an insulating layer 204, and two spaced surface portions 206 and 208 to which are connected a signal source 220 and a load 230, respectively. A control voltage 240 is applied across the electrode 202 and ground.

The switching device 200, which is fabricated similar to transistor structures, comprises a substrate 201, typically an alloy of 15 percent Si and 85 percent Ge, 30$\mu$ in thickness. The substrate 201 is separated from a gold electrode 202 2$\mu$ in thickness, by a $SiO_2$ insulating layer, 0.3$\mu$ in thickness. Both of the latter are typically fabricated by well-known vapor deposition techniques. Diffused into the substrate 201 to a depth of 3$\mu$ are two spaced surface contacts 206 and 208, typically $n+$ type material. These dimensions and materials are illustrative only and are not to be construed as a limitation upon the scope of the invention.

The mode of operation is essentially as follows. A control voltage 240 is applied across electrode 202 and ground thereby to produce an electric field across the device 200. The electric field causes an increase in electron construction in the channel 210 extending from contact 206 to 208, and subsequently an increase in the transition temperature of the channel 210. Thus, the channel 210, which was in the resistive state, electrostatically switches to a superconducting state thereby allowing the flow of signal energy from source 220 through contact 206, across channel 210, through contact 208 and ultimately to load 230.

Thus the operation of switching device 200 is completely analogous to the priorly discussed embodiments, entailing the formation by electrostatic means of a superconducting channel in an otherwise resistive material.

The many ramifications of switching device 10 involving the use of ferroelectric insulators can be employed equally as well in the switching device 200.

Thus, it is to be understood that the above-described arrangements are merely illustrative of the many possible specific embodiments which can be devised to represent applications of the principles of the invention. Numerous and varied other arrangements can readily be devised in accordance with these principles by those skilled in the art without departing from the spirit and scope of the invention.

What is claimed is:

1. A logic device comprising
   a layer of a superconductive material exhibiting a state of high resistance above its characteristic transition temperature and a superconducting state of low resistance below its transition temperature, the temperature of said layer being initially above the transition temperature,
   means for defining at least one current channel through a portion of said superconductive layer,
   means for maintaining constant the total carrier population within said superconductive layer, and
   means for increasing the transition temperature of said channel above the temperature of said layer comprising means for establishing a majority carrier density gradient in said layer whereby the concentration of majority carriers in said channel is increased thereby to cause said channel to switch from a high resistance state to a superconducting state.
2. The logic device of claim 1 wherein
   said means for establishing a majority carrier density gradient in said superconductive layer comprises means for applying an electric field across said superconductive layer, and
   said means for maintaining constant the total carrier population within said superconductive layer comprises a pair of insulative layers deposited on opposite surfaces of said superconductive layer, said insulative layers being impervious to carrier flow.
3. The logic device of claim 1 wherein
   said means for establishing a majority carrier density gradient in said superconductive layer comprises at least one ferroelectric insulating layer deposited on said superconductive layer, said ferroelectric layer having a characteristic polarization field, and in combination with
   means for reversing the polarity of the polarization field comprising means for applying an electric field across said ferroelectric layer of a polarity opposite to the polarity of the polarization field.
4. The logic device of claim 1 for use as an electric field level detector in combination with
   a current source connected to said superconductive layer,
   a current detector, and wherein
   said means for defining at least one current channel comprises a plurality of contacts connected to said superconductive layer at points of varying depths thereof, said contacts being coupled to said current detector, and
   said means for establishing a majority carrier density gradient in said layer comprises means for varying the depth of said channel in relation to the strength of the electric field to be detected comprising means for applying the electric field transverse to said superconductive layer, whereby the number of said contacts in which current is detected is to a good approximation a measure of the strength of the applied electric field.

References Cited

UNITED STATES PATENTS

| | | | |
|---|---|---|---|
| 2,791,758 | 5/1957 | Looney | 317—235 |
| 3,021,433 | 2/1962 | Morrison | 317—235 |
| 3,204,116 | 8/1965 | Parmenter | 307—88.5 |

JOHN W. HUCKERT, *Primary Examiner.*

J. D. CRAIG, *Assistant Examiner.*